(12) United States Patent
Guo et al.

(10) Patent No.: US 12,615,999 B2
(45) Date of Patent: Apr. 28, 2026

(54) CHIP BONDING METHOD

(71) Applicant: WUHAN XINXIN SEMICONDUCTOR MANUFACTURING CO., LTD., Wuhan (CN)

(72) Inventors: Wanli Guo, Wuhan (CN); Tianjian Liu, Wuhan (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 373 days.

(21) Appl. No.: 18/265,902

(22) PCT Filed: Feb. 26, 2021

(86) PCT No.: PCT/CN2021/078279
§ 371 (c)(1),
(2) Date: Jun. 7, 2023

(87) PCT Pub. No.: WO2022/121121
PCT Pub. Date: Jun. 16, 2022

(65) Prior Publication Data
US 2023/0377938 A1     Nov. 23, 2023

(30) Foreign Application Priority Data

Dec. 10, 2020    (CN) .......................... 202011452297.7

(51) Int. Cl.
H01L 21/683       (2006.01)
H01L 21/02        (2006.01)
(Continued)

(52) U.S. Cl.
CPC .... H01L 21/6836 (2013.01); H01L 21/02076 (2013.01); H01L 21/60 (2021.08);
(Continued)

(58) Field of Classification Search
CPC ........... H01L 21/6836; H01L 21/02076; H01L 21/60; H01L 21/76804; H01L 24/89;
(Continued)

(56) References Cited

U.S. PATENT DOCUMENTS 7,157,787 B2 *    1/2007  Kim ................... H01L 21/76831
                                                    257/621
8,482,132 B2 *    7/2013  Yang ........................ H01L 24/80
                                                    257/777
(Continued)

FOREIGN PATENT DOCUMENTS

CN          105185798 A      12/2015
CN          106800272 A      6/2017
(Continued)

*Primary Examiner* — Vu A Vu

(74) *Attorney, Agent, or Firm* — Muncy, Geissler, Olds & Lowe, P.C.

(57)                ABSTRACT

A die bonding method is disclosed, through coating bonding adhesive on front side of device wafer and bonding carrier wafer thereto, back-side connection structure can be formed on back side of device wafer to lead out an interconnect structure in device wafer to back side of device wafer, and dies thereon can be bonded at front sides to target wafer. Moreover, after device wafer is debonded from carrier wafer, the bonding adhesive is retained on front side of device wafer to provide protection to front side of device wafer during subsequent dicing of device wafer, and to avoid particles or etching by-products produced during dicing process from adhering to front side of device wafer. Such etching by-products are subsequently removed along with the bonding adhesive, ensuring cleanness of front sides of individual dies resulting from dicing process and improved quality of bonding of dies at front sides to target wafer.

12 Claims, 5 Drawing Sheets

(51) Int. Cl.

| | |
|---|---|
| *H01L 21/60* | (2006.01) |
| *H01L 21/768* | (2006.01) |
| *H01L 23/00* | (2006.01) |
| *H10D 89/00* | (2025.01) |

(52) U.S. Cl.

CPC ........ *H01L 21/76804* (2013.01); *H01L 24/89* (2013.01); *H10D 89/013* (2025.01); *H01L 2221/68327* (2013.01); *H01L 2221/68354* (2013.01); *H01L 2221/68372* (2013.01); *H01L 2224/89* (2013.01); *H01L 2924/37001* (2013.01)

(58) Field of Classification Search

CPC . H01L 2221/68327; H01L 2221/68354; H01L 2221/68372; H01L 2224/89; H01L 2924/37001; H01L 21/76898; H01L 2221/6834; H01L 2221/68345; H01L 2221/68381; H01L 21/683; H01L 21/6835; H01L 21/78; H01L 24/80; H01L 2224/80001; H01L 2224/80894; H10D 89/013

USPC .......................................................... 438/464

See application file for complete search history.

(56) References Cited

U.S. PATENT DOCUMENTS

| | | | | |
|---|---|---|---|---|
| 9,443,783 | B2 * | 9/2016 | Lin ........................ | H01L 21/563 |
| 9,953,941 | B2 * | 4/2018 | Enquist .................... | H01L 24/80 |
| 10,535,597 | B2 * | 1/2020 | Chen .................... | H01L 21/4853 |
| 10,658,240 | B1 * | 5/2020 | Iriguchi ................... | H01L 24/09 |
| 11,315,855 | B2 * | 4/2022 | Chen ................. | H01L 23/49827 |
| 11,342,282 | B2 * | 5/2022 | Shih ........................ | H01L 24/18 |
| 11,355,441 | B2 * | 6/2022 | Nomura ................. | H01L 25/50 |
| 11,929,261 | B2 * | 3/2024 | Chang ................. | H01L 23/3121 |

FOREIGN PATENT DOCUMENTS

| | | |
|---|---|---|
| CN | 108074823 A | 5/2018 |
| CN | 111009541 A | 4/2020 |

* cited by examiner

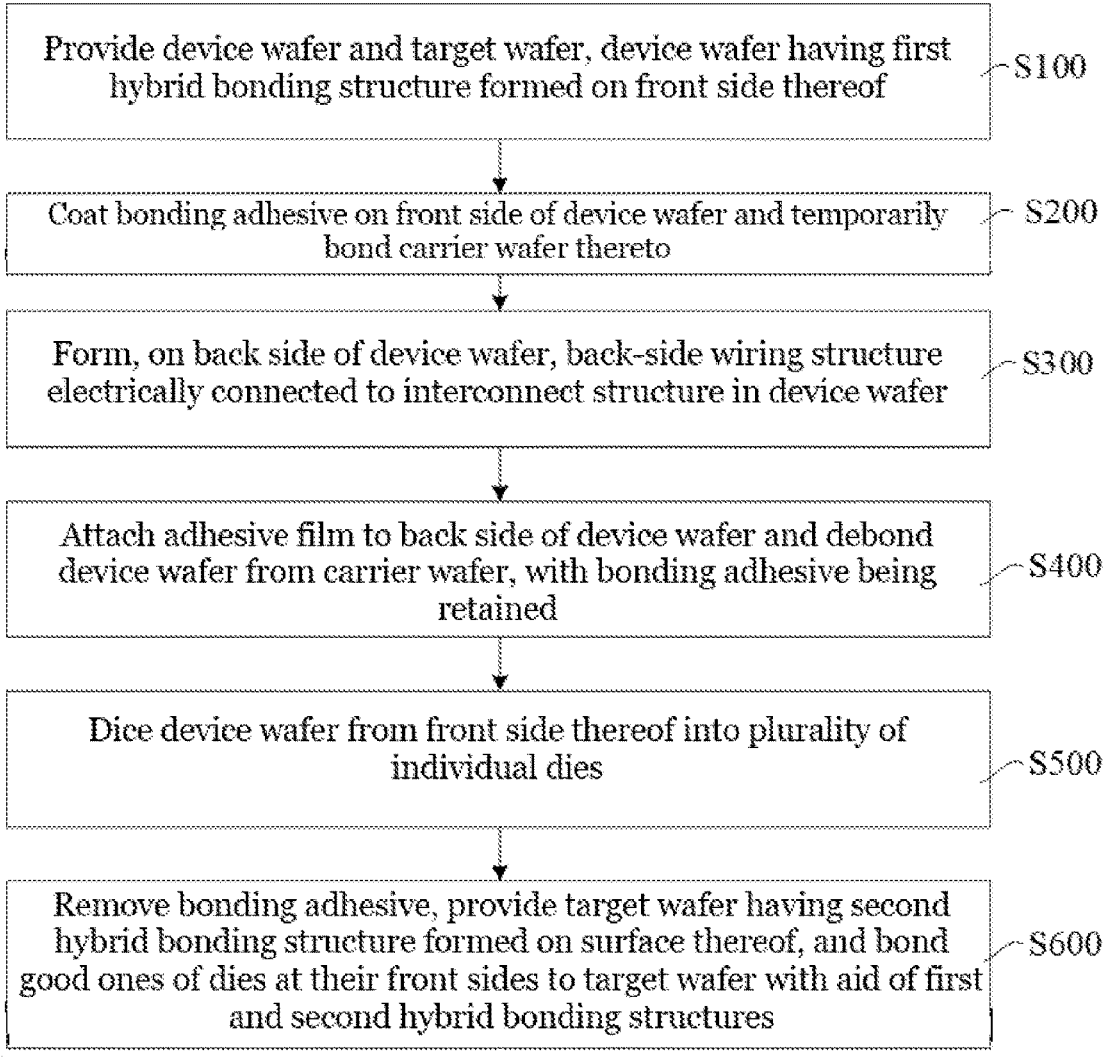

Provide device wafer and target wafer, device wafer having first hybrid bonding structure formed on front side thereof — S100

Coat bonding adhesive on front side of device wafer and temporarily bond carrier wafer thereto — S200

Form, on back side of device wafer, back-side wiring structure electrically connected to interconnect structure in device wafer — S300

Attach adhesive film to back side of device wafer and debond device wafer from carrier wafer, with bonding adhesive being retained — S400

Dice device wafer from front side thereof into plurality of individual dies — S500

Remove bonding adhesive, provide target wafer having second hybrid bonding structure formed on surface thereof, and bond good ones of dies at their front sides to target wafer with aid of first and second hybrid bonding structures — S600

Fig. 1

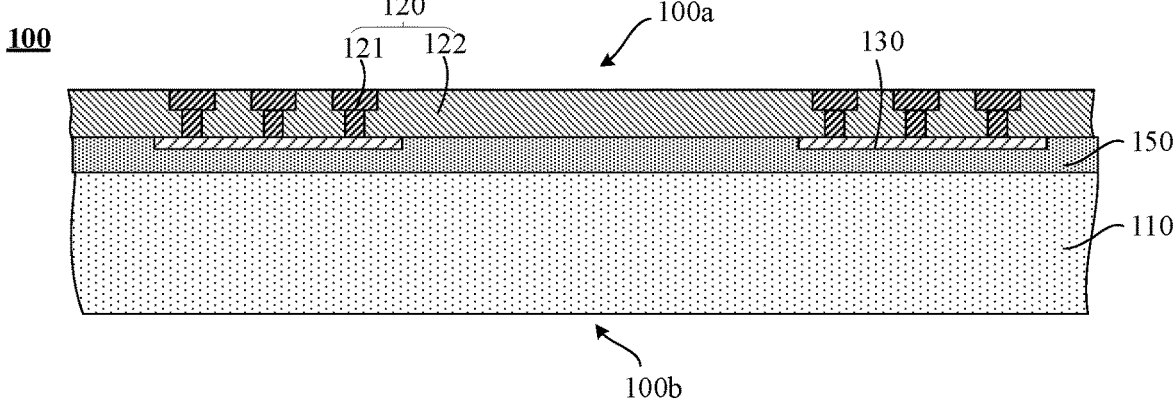

Fig. 2a

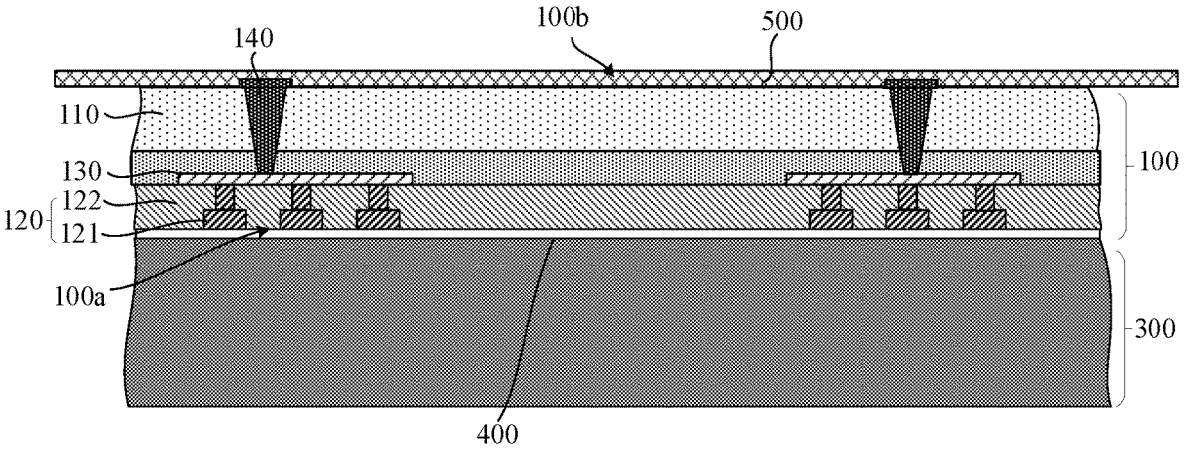
Fig. 5
Fig. 6
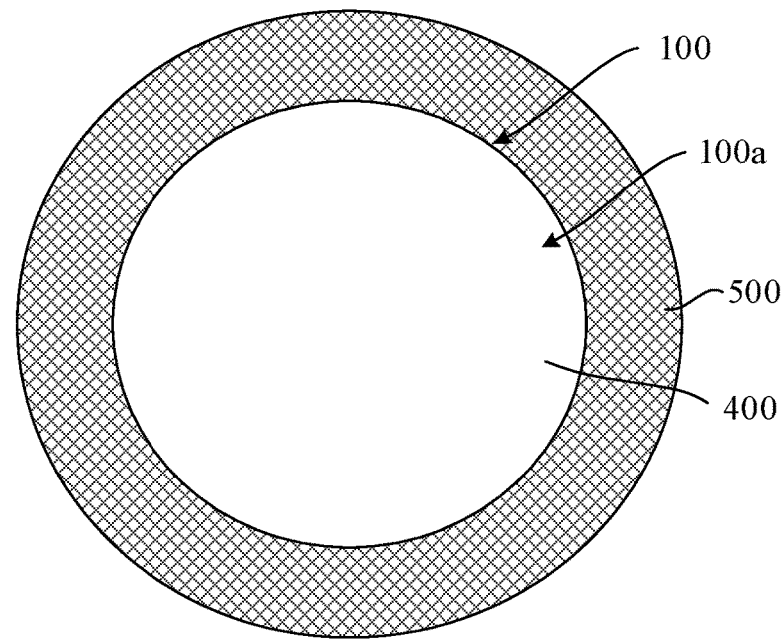
Fig. 7

CHIP BONDING METHOD

TECHNICAL FIELD

The present invention relates to die packaging technology and, in particular, to a die bonding method.

BACKGROUND

As semiconductor technology steps into the post-Moore's law era, catering to the demand for higher integration and higher performance, chip structures are evolving toward three-dimensional (3D) stacking. "Heterogeneous hybrid" integration realized by bonding strategies is one of the important "More than Moore" (MtM) techniques. Such a bonding process is capable of high-density interconnection of dies from different technology process nodes, enabling system-level integration with a smaller size, higher performance and lower power consumption. The existing bonding methods typically include wafer-to-wafer (W2W) bonding, chip-to-chip (C2C) bonding and chip-to-wafer (C2W) bonding. C2W bonding is favored by global semiconductor giants because it can screen out defective dies and enables a high yield.

C2W bonding can be achieved by simple metal bonding, or by hybrid bonding with higher bonding strength. Since hybrid bonding is advantageous in higher I/O connection density and better heat dissipation, it has found extensive use. Hybrid bonding is extremely demanding on die surface cleanness. However, at present, a wafer is diced into individual dies typically by cutting the wafer with a grinding wheel until a substrate of the wafer is reached and then etching through the substrate. Particles produced during the grinding operation and etching by-products resulting from the etching process tend to adhere to the surface of the resultant dies and are difficult to remove, which may lead to degraded surface cleanness of the dies and hence poor hybrid bonding quality.

SUMMARY OF THE INVENTION

It is an objective of the present invention to provide a die bonding method, which can ensure die surface cleanness and hence improved bonding quality.

To this end, the present invention provides a die bonding method including:

providing a device wafer having a first hybrid bonding structure formed on a front side thereof;

coating a bonding adhesive on the front side of the device wafer and temporarily bonding a carrier wafer thereto;

forming, on a back side of the device wafer, a back-side connection structure electrically connected to a first interconnect structure in the device wafer;

debonding the device wafer from the carrier wafer, with the bonding adhesive being retained;

dicing the device wafer from the front side thereof into a plurality of individual dies; and removing the bonding adhesive, providing a target wafer having a second hybrid bonding structure formed on a surface thereof, and bonding good ones of the dies at their front sides to the target wafer with the aid of the first and second hybrid bonding structures.

Optionally, the method may further include, attaching an adhesive film to the back side of the device wafer, before the device wafer is debonded from the carrier wafer.

Optionally, the method may further include, after the back-side connection structure is formed on the back side of the device wafer and before the adhesive film is attached to the back side of the device wafer, testing all the dies of the device wafer to mark the good dies.

Optionally, the back-side connection structure may include TSVs and pads.

Optionally, the device wafer may include a substrate and a dielectric layer on the substrate, wherein the first interconnect structure of the device wafer is formed in the dielectric layer, and wherein the step of dicing the device wafer from the front side thereof into the individual dies includes:

cutting at least the bonding adhesive, the first hybrid bonding structure and the dielectric layer from the front side of the device wafer with a grind wheel to form horizontal and vertical dicing lanes, which expose a surface of the substrate or further extend into the substrate, and adjacent ones of which define the individual dies therebetween; and performing an etching process along the dicing lanes, which proceeds downward through the substrate, thereby completely separating adjacent dies.

Optionally, after the bonding adhesive is removed, the adhesive film may be stretched to widen gaps between adjacent dies.

Optionally, each of the first and second hybrid bonding structures may include an insulating bonding layer and conductive bonding pads located within the insulating bonding layer, the conductive bonding pads in the first hybrid bonding structure electrically connected to the first interconnect structure in the device wafer, the conductive bonding pads in the second hybrid bonding structure electrically connected to a second interconnect structure in the target wafer.

Optionally, the good dies may be boned at their front sides to the target wafer with the aid of the first and second hybrid bonding structures in such a manner that the insulating bonding layers in the first and second hybrid bonding structures are aligned with each other, with their tops surfaces adhering to each other, and that the conductive bonding pads in the first and second hybrid bonding structures are aligned with each other, with gaps being left between their top surfaces.

Optionally, the method may further include, after the bonding adhesive is removed and before the good dies are boned at their front sides to the target wafer with the aid of the first and second hybrid bonding structures, activating the insulating bonding layers of the first hybrid bonding structure and/or the second hybrid bonding structure with plasma.

Optionally, a material of the conductive bonding pads in the first hybrid bonding structure may include copper, wherein an time interval from the formation of the first hybrid bonding structure on the front side of the device wafer to the coating of the bonding adhesive on the front side of the device wafer is defined as a first waiting time and a time interval from the removal of the bonding adhesive to the bonding of the good dies at their front sides to the target wafer with the aid of the first and second hybrid bonding structures as a second waiting time, and the sum of the first and second waiting time is shorter than or equal to 24 hours.

Optionally, the device wafer may have undergone a redistribution layer forming process but not an aluminum pad forming process, and the target wafer may have undergone a redistribution layer forming process and/or an aluminum pad forming process.

Optionally, the bonding adhesive may be removed using a wet cleaning process.

The die bonding method of the present invention provides the following benefits:

1) Through coating the bonding adhesive on the front side of the device wafer and bonding the carrier wafer thereto, the back-side connection structure can be formed on the back side of the device wafer to lead out the interconnect structure in the device wafer to the back side of the device wafer and the front sides of the dies can be bonded to the target wafer. Moreover, after the device wafer is debonded from the carrier wafer, the bonding adhesive is retained on the front side of the device wafer in order to provide protection to the front side of the device wafer during the subsequent dicing of the device wafer, and to avoid particles or etching by-products produced during the dicing process from adhering to the front side of the device wafer. Such etching by-products are subsequently removed along with the bonding adhesive, ensuring cleanness of the front sides of the individual dies resulting from the dicing process and improved quality of bonding of the dies at their front sides thereof to the target wafer.

2) During the dicing of the device wafer, the bonding adhesive remaining on the front side of the device wafer can function in the same way as photoresist. As the etchant used in the etching of the substrate generally shows a high selectivity to the adhesive, the adhesive can protect the front side of the device wafer against possible damage that may be caused by the etching process, thus dispensing with the need for additional photoresist coating and exposure. This results in increases in process simplicity and production efficiency.

3) The back-side connection structure is formed after the bonding adhesive is coated and the carrier wafer is bonded to provide support. With the front side of the device wafer being protected by the bonding adhesive, no process step or process complexity will be added.

4) The conductive bonding pads in the first hybrid bonding structure are often made of copper, which is susceptible to oxidation that may lead to degraded bonding quality. The bonding adhesive retained on the front side of the device wafer after the device wafer is debonded from the carrier wafer can prevent to some extent the conductive bonding pads from being oxidized, resulting in improved bonding quality.

5) The time interval from the formation of the matching hybrid bonding structures respectively on the front side of the device wafer and the front side of the target wafer to the coating of the bonding adhesive on the front side of the device wafer is defined as a first waiting time, and the time interval from the removal of the bonding adhesive to the bonding of the good dies from the device wafer at their front sides to the target wafer with the aid of the hybrid bonding structures as a second waiting time. Since the conductive bonding pads in the device wafer is exposed in air during the first and second waiting times, the sum of the first and second waiting times is controlled within 24 hours or shorter, thereby additionally preventing the conductive bonding pads from being oxidized.

6) Compared with testing the device wafer and marking good dies thereon after the completion of fabrication thereof, testing the device wafer and marking good dies thereon after the back-side connection structure is formed on the back side of the device wafer enables screening out of any die that becomes defective during the bonding of the carrier wafer or during the formation of the back-side connection structure, resulting in an increased yield of the resultant bonded dies.

7) After the bonding adhesive is removed and before the good dies are bonded at their front sides to the target wafer, the insulating bonding layer(s) in the first hybrid bonding structure and/or the second hybrid bonding structure may be activated with plasma to have enhanced bonding strength. As a result, the good dies can be pre-bonded to the target wafer at room temperature and atmospheric pressure, reducing the requirements on the bonding process and broadening the process window.

BRIEF DESCRIPTION OF THE DRAWINGS

FIG. 1 is a flowchart of a die bonding method according to an embodiment of the present invention.

FIGS. 2a, 2b, and 3 to 11 are schematic illustrations of structures resulting from corresponding steps in a die bonding method according to an embodiment of the present invention.

In these figures:

100—device wafer; 100a—front side of the device wafer; 100b—back side of the device wafer; 110—first substrate; 120—first hybrid bonding structure; 122—first insulating bonding layer; 121—first conductive bonding pad; 130—first interconnect structure; 140—back-side connection structure; 150—first dielectric layer;

200—target wafer; 200a—front side of the target wafer; 200b—back side of the target wafer; 210—second substrate; 220—second hybrid bonding structure; 222—second insulating bonding layer; 221—second conductive bonding pad; 230—second interconnect structure; 250—second dielectric layer;

300—first carrier wafer; 400—bonding adhesive; 500—adhesive film; 100c—die; 100d—good die from the device wafer.

DETAILED DESCRIPTION

Specific embodiments of the present invention will be described in greater detail below with reference to the accompanying schematic drawings. Advantages and features of the present invention will become more apparent from the following description. Note that the figures are provided in a very simplified form not necessarily drawn to exact scale and for the only purpose of facilitating easy and clear description of the embodiments.

FIG. 1 is a flowchart of a die bonding method according to an embodiment of the present invention. As shown in FIG. 1, the die bonding method includes the steps of:

step S100: providing a device wafer and a target wafer, a front side of the device wafer having a first hybrid bonding structure formed thereon;

step S200: coating a bonding adhesive on the front side of the device wafer and temporarily bonding a carrier wafer thereto;

step S300: forming a back-side connection structure on a back side of the device wafer, the back-side connection structure electrically connected to an interconnect structure in the device wafer;

step S400: attaching an adhesive film to the back side of the device wafer and debonding the device wafer from the carrier wafer, with the bonding adhesive being retained;

step S500: dicing the device wafer from the front side of the device wafer into a plurality of individual dies; and step S600: removing the bonding adhesive, providing the target wafer, a surface of the target wafer having a second hybrid bonding structure formed thereon, and bonding good ones of the dies at their front sides to the target wafer with the aid of the first and second hybrid bonding structures.

Reference is now made specifically to FIGS. 2a, 2b, and 3 to 11, which are schematic illustrations of structures resulting from corresponding steps in a die bonding method according to an embodiment of the present invention. The method will be described in detail below with reference to FIGS. 2a, 2b, and 3 to 11.

Figures 2B, 3, 4:
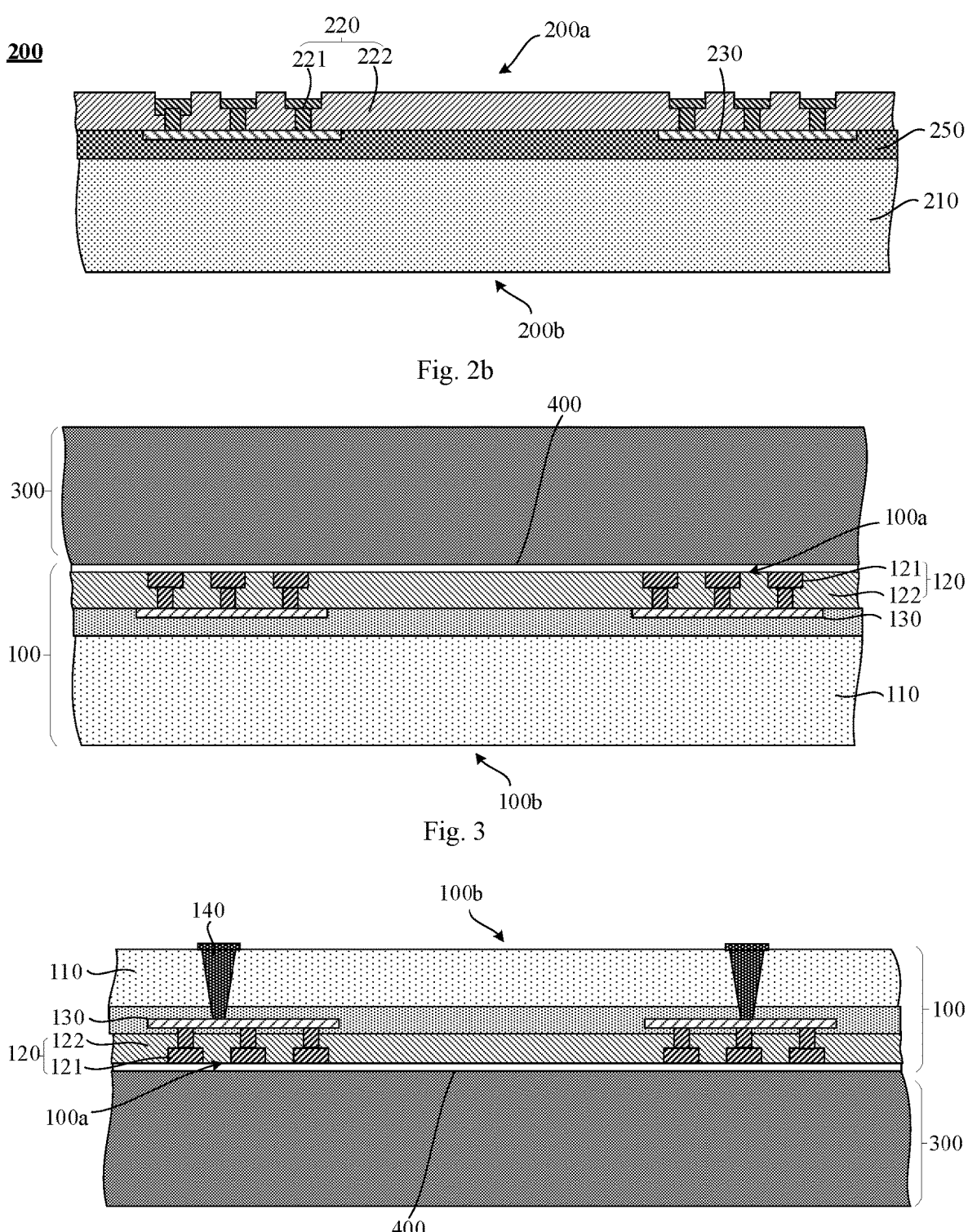

First of all, referring to FIGS. 2a and 2b, in step S100, a device wafer 100 and a target wafer 200 are provided. Each of the device wafer 100 and the target wafer 200 includes a substrate and a hybrid bonding structure on the substrate. Specifically, the device wafer 100 includes a first substrate 110 and a first hybrid bonding structure 120 formed on the first substrate 110, and the target wafer 200 includes a second substrate 210 and a second hybrid bonding structure 220 on the second substrate 210. The first hybrid bonding structure 120 matches the second hybrid bonding structure 220.

First device structures are formed in the first substrate 110 and the second device structures are formed in the second substrate 210. A first interconnect structure 130 electrically connected to the first device structures is formed on the first substrate 110 and a second interconnect structure 230 electrically connected to the second device structures on the second substrate 210. The first interconnect structure 130 and the second interconnect structure 230 are located within a first dielectric layer 150 and a second dielectric layer 250, respectively. Each of the first dielectric layer 150 and the second dielectric layer 250 may include multiple layers. For example, each of the first dielectric layer and the second dielectric layer may include an interlayer dielectric layer and an inter-metal dielectric layer. Each of the first interconnect structure 130 and the second interconnect structure 230 is wrapped by the dielectric material. The first and second device structures may be MOS devices, sensor devices, storage devices and/or other passive devices.

Each of the first interconnect structure 130 and the second interconnect structure 230 may include multiple layers (represented by one layer in FIGS. 2a and 2b for the illustrative purpose). The layers may be interconnected by electrical connections such as contact plugs, wiring layers, and/or vias. Each of the first interconnect structure 130 and the second interconnect structure 230 may be formed of a metal material such as tungsten, aluminum or copper.

The first hybrid bonding structure 120 and the second hybrid bonding structure 220 are located on top surfaces of the device wafer 100 and the target wafer 200, respectively. The top surfaces are surfaces where the first interconnect structure 130 or the second interconnect structure 230 is formed and may also be respectively referred to as a front side 100a of the device wafer 100 and a front side 200a of the target wafer 200. The device wafer 100 also has a back side 100b opposite the front side 100a, and the target wafer 200 also has a back side 200b opposite the front side 200a.

Each of the first hybrid bonding structure 120 and the second hybrid bonding structure 220 has a bonding interface formed by different bonding materials. In this embodiment, the first hybrid bonding structure 120 includes a first insulating bonding layer 122 and first conductive bonding pads 121. The first conductive bonding pads 121 are located within the first insulating bonding layer 122 and electrically connected to the first interconnect structure 130. The second hybrid bonding structure 220 includes a second insulating bonding layer 222 and second conductive bonding pads 221. The second conductive bonding pads 221 are located within the second insulating bonding layer 222 and electrically connected to the second interconnect structure 230. Generally, the first conductive bonding pads 121 and the second conductive bonding pads 221 are formed on the first interconnect structure 130 and the second interconnect structure 230, respectively, and are electrically connected to interconnecting wires on the top of the first interconnect structure 130 and the second interconnect structure 230, respectively, thereby electrically leading out the interconnect structures.

Optionally, each of the first insulating bonding layer 122 and the second insulating bonding layer 222 may be dielectric materials suitable for bonding. Each of them may consist of a single layer or stacked multiple layers. For example, each of them may consist of silicon oxide, silicon nitride, silicon oxynitride, nitrogen-doped silicon carbide (NDC) or a combination thereof. The first conductive bonding pads 121 and the second conductive bonding pads 221 may be each made of a conductive bonding material such as a metal bonding material such as copper, gold or an alloy.

Each of the first hybrid bonding structure 120 and the second hybrid bonding structure 220 may be formed by a process including the steps of: forming an insulating layer on the front side 100a of the device wafer 100 or the front side 200a of the target wafer 200; etching the insulating layer to form openings therein, with the remainder serving as the first insulating bonding layer 122 or the second insulating bonding layer 222; and finally, forming the first conductive bonding pads 121 or the second conductive bonding pads 221 by filling the conductive material in the openings.

With continued reference to FIGS. 2a and 2b, it would be appreciated that the first hybrid bonding structure 120 also matches the second hybrid bonding structure 220. That is, the first conductive bonding pads 121 are positionally aligned with the second conductive bonding pads 221, and the first insulating bonding layer 122 are positionally aligned with the second insulating bonding layer 222. In this way, they can be bonded together by dielectric-to-dielectric bonds and metal-to-metal bonds.

Additionally, in this embodiment, top surfaces of the first conductive bonding pads 121 are flush with a top surface of the first insulating bonding layer 122, while top surfaces of the second conductive bonding pads 221 are lower than a top surface of the second insulating bonding layer 222. In this way, after bonding, the top surface of the first insulating bonding layer 122 adheres to the top surface of the second insulating bonding layer 222, while gaps are left between the top surfaces of the first conductive bonding pads 121 and the top surfaces of the second conductive bonding pads 221. The first conductive bonding pads 121 and the second conductive bonding pads 221 will expand when heated during bonding, and the gaps can prevent overflow of the materials of the first conductive bonding pads 121 and the second conductive bonding pads 221 when they expand and squeeze each other, which may lead to a short circuit. In alternative embodiments, the top surfaces of the first conductive bonding pads 121 may be higher or lower than the top surface of the first insulating bonding layer 122. In these embodiments, the top surfaces of the second conductive bonding pads 221 may be accordingly adjusted in height to ensure that there are gaps between the first conductive bonding pads 121 and the second conductive bonding pads 221. Of course, the gaps should be sized according to the materials of the first conductive bonding pads 121 and the second conductive bonding pads 221 in order to ensure that the top surfaces of the first conductive bonding pads 121 adhere to the top surfaces of the second conductive bonding pads 221 after bonding.

In this embodiment, the front side 100a of the device wafer 100 may have undergone a redistribution layer forming process but not an aluminum pad forming process, while the front side 200a of the target wafer 200 may have undergone a redistribution layer forming process and/or an aluminum pad forming process. Since dies on the device wafer 100 are intended to be bonded at their front sides to the front side 200a of the target wafer 200, the aluminum pad forming process may be omitted, resulting in increased process simplicity. It would be appreciated that the aluminum pad forming process as mentioned in this embodiment refers to a process for forming thick aluminum pads on a redistribution layer as lead-out terminals of the dies.

Referring to FIG. 3, in step S200, a bonding adhesive 400 is coated on the front side 100a of the device wafer 100, and a carrier wafer 300 is temporarily bond to the front side 100a of the device wafer 100. The carrier wafer 300 may be a single-layer wafer intended only to provide support. Therefore, it may be a substrate that has not undergone any device fabrication process. For example, it may be a silicon substrate, a glass substrate or a support substrate made of a different material. As a result of the temporary bonding of the carrier wafer 300 and the device wafer 100 achieved by the bonding adhesive 400, the device wafer 100 is firmly attached to the carrier wafer 300, facilitating the subsequent processes on the back side 100b of device wafer 100, including but not limited to, the formation of a back-side connection structure and thinning.

Referring to FIG. 4, in step S300, the device wafer 100 may be thinned from the back side 100b. Specifically, a polishing process is performed on the first substrate 110 to reduce the thickness of the first substrate 110. This can avoid the formation of deep through-silicon via (TSV) holes in the first substrate 110 by etching and filling of a significant amount of a metal material therein during the subsequent formation of the back-side connection structure.

With continued reference to FIG. 4, with support of the first carrier wafer 300, a back-side connection structure 140 is formed on the back side 100b of the device wafer 100. The back-side connection structure 140 is electrically connected to the first interconnect structure 130, thereby leading out the first interconnect structure 130. The formation of the back-side connection structure 140 may particularly include the following steps. A dielectric layer (e.g., a silicon oxide layer, not shown) may be deposited on the back side 100b of the device wafer 100, and a mask layer (not shown) may be then formed on the dielectric layer. The mask layer may be a photoresist layer. Subsequently, a photolithography process may be carried out to pattern the mask layer. Next, with the mask layer serving as a mask, the dielectric layer and the first substrate 110 may be etched, for example, by reactive-ion etching (RIE), resulting in the formation of TSV holes extending from a surface of the first substrate 110 to the first interconnect structure 130 (typically to the interconnecting wires on the top of the first interconnect structure 130). A barrier layer may be then deposited on inner walls of the TSV holes to avoid the subsequently-filled metal material from diffusing into the first substrate 110. The barrier layer on bottom surfaces of the TSV holes may be etched away, and a metal material such as gold, silver, copper or nickel may be deposited to fill up the TSV holes and cover the first substrate 110. The metal material may be then planarized and etched, thereby forming conductive connections in the TSV holes, which are electrically connected to the first interconnect structure 130, and pads electrically connected to the conductive connections.

With continued reference to FIG. 4, all the dies on the device wafer 100 are tested, and good ones of them (known good dies (KGDs)) are identified and marked. In this way, during the subsequent bonding of the dies at their front sides to the target wafer 200, only good ones are bonded, and any defective die is discarded. This can result in an increased yield of devices obtained from the bonding. Moreover, compared with testing the device wafer 100 and marking good dies thereon after the completion of fabrication thereof, testing the device wafer 100 and marking good dies thereon after the back-side connection structure 140 is formed on the back side 100b of the device wafer 100 enables screening out of any die that becomes defective during the bonding of the carrier wafer 300 or during the formation of the back-side connection structure 140, resulting in an increased yield of the resultant bonded dies.

Referring to FIG. 5, in step S400, an adhesive film 500 is attached to the back side 100b of device wafer 100. The adhesive film 500 may be a thin film with adhesiveness, such as a blue tape or an ultraviolet (UV) tape. The adhesive film 500 is able to adhesively retain every die after the device wafer 100 is diced, enabling the device wafer 100 to maintain its integral wafer shape rather than fall apart after the dicing process. Moreover, the blue or UV tape can protect the semiconductor structures on the back side of the device wafer 100 from contamination in subsequent processes and from oxidization of metal components thereof due to exposure in air.

Referring to FIGS. 6 to 7, the device wafer 100 is debonded from the carrier wafer 300, and the carrier wafer 300 is removed. After the debonding, the device wafer 100 is not subject to any adhesive removal process, and the bonding adhesive 400 is still retained on the front side 100a of the device wafer 100. As a result, the bonding adhesive 400 that still covers the front side 100a of the device wafer 100 can protect the bonding interface on the front side of the device wafer 100 from contamination in subsequent processes, and can particularly prevent metal regions of the bonding interface on the front side of the device wafer 100 from being oxidized due to exposure in air.

Figure 8:
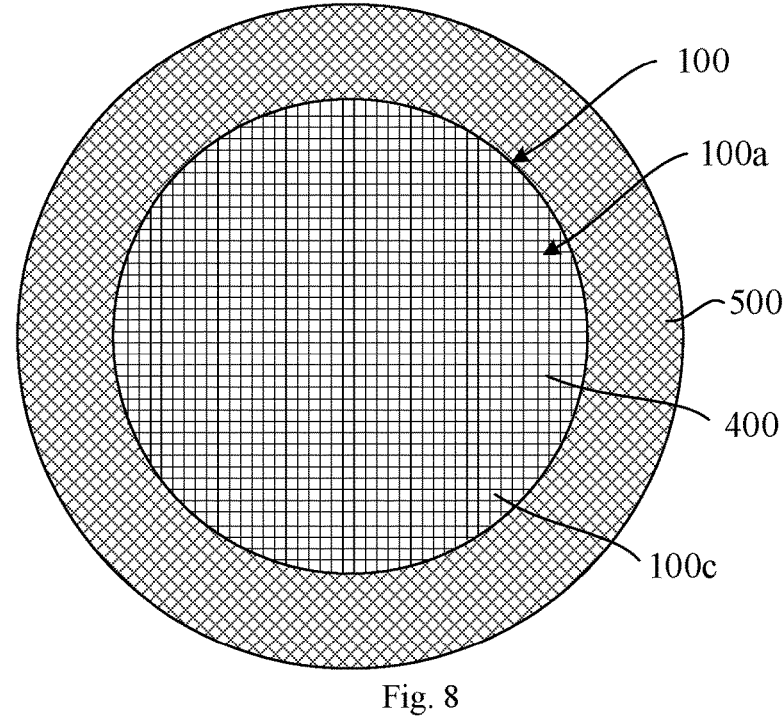

Referring to FIGS. 6 to 8, in step S500, the device wafer 100 is diced from the front side 100a into individual dies. The dicing of the device wafer 100 may include the following steps. The device wafer 100 may be first cut from the front side 100a with a grinding wheel. The grinding wheel may pass through the bonding adhesive 400, the first hybrid bonding structure 120 and the first dielectric layer 150 and stop at the first substrate 110 (or even pass through a partial thickness of the first substrate 110). As a result, horizontal and vertical first dicing lanes may be formed, in which the surface of the first substrate is exposed (or they may extend into the first substrate). Adjacent dicing lanes define the dies 100c therebetween. Subsequently, for example, a dry etching process may be performed along the dicing lanes to etch the first substrate 110 to extend through the first substrate 110, thereby separating the device wafer 100 into the individual dies 100c. Alternatively, laser cutting may be utilized to dice device wafer 100 into the individual dies 100c. Each die 100c may also have a front side and a back side. The front side of each die 100c corresponds to the front side 100a of the device wafer 100, and the back side of each die 100c corresponds to the back side 100b of the device wafer 100. Thus, the front side of each die 100c has part of the first hybrid bonding structure 120 and the back side of each die 100c has part of the back-side connection structure 140.

It would be appreciated that, as the adhesive film 500 adhesively retains the dies 100c, at this time, the device wafer 100 still maintains its integral wafer shape.

With continued reference to FIGS. 6 to 8, particles may be produced during the cutting of the bonding adhesive 400, the first hybrid bonding structure 120 and the first dielectric layer 150 with the grinding wheel. Moreover, etching by-products are usually produced during the etching process on the first substrate 110. Such particles and etching by-products tend to adhere to the front side 100a of the device wafer 100. In this embodiment, since the front side 100a of the device wafer 100 is covered by the bonding adhesive 400, the particles and etching by-products will adhere to the bonding adhesive 400 and can be subsequently removed together with the bonding adhesive 400. This ensures cleanness of the front sides of the dies 100c, resulting in improved quality of bonding of the dies 100c at their front sides to the target wafer 200.

Additionally, in order to avoid damage to the front side 100a of the device wafer 100 during the etching of the first substrate 110, in the prior art, before the dicing process, a layer of photoresist is usually formed on the front side 100a of the device wafer 100 and then exposed to result in exposure of the dicing lanes. In contrast, in this embodiment, as the etchant used in the etching of the first substrate 110 generally exhibits a high selectivity to the adhesive, the bonding adhesive 400 on the front side 100a of the device wafer 100 can function in the same way as photoresist to protect the front side 100a of the device wafer 100 against possible damage that may be caused by the etching process, dispensing with the need for additional photoresist coating and exposure. This results in increases in process simplicity and production efficiency. Further, the back-side connection structure 140 is formed after the bonding adhesive 400 and coated and the carrier wafer 300 is bonded to provide support. With the front side 100a of the device wafer 100 being protected by the bonding adhesive 400, no process step or process complexity will be added.

Further, in this embodiment, the first conductive bonding pads 121 and the second conductive bonding pads 221 are both made of copper, which is susceptible to oxidation that may lead to degraded bonding quality. The bonding adhesive 400 retained on the front side 100a of the device wafer 100 can prevent to some extent the first conductive bonding pads 121 from being oxidized (and the second conductive bonding pads 221 may be coated with a special protective layer which can prevent their oxidation), resulting in improved bonding quality.

Figure 9:
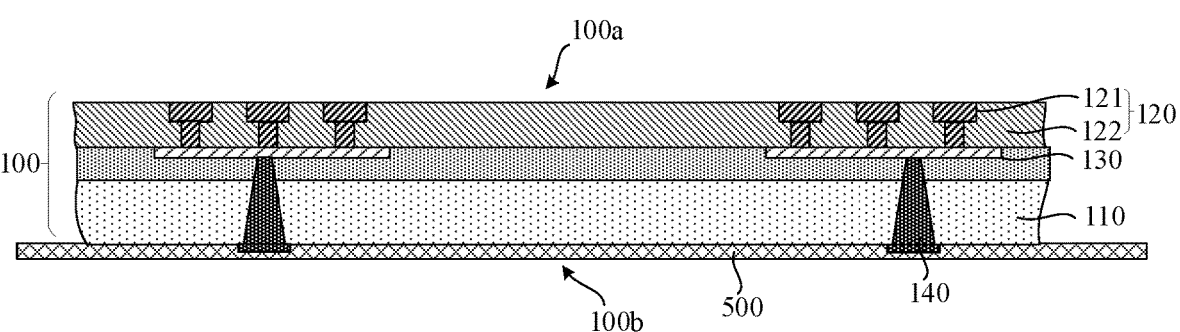

Referring to FIGS. 8 and 9, in step S600, after the device wafer 100 is diced, the bonding adhesive 400 on the front side 100a of the device wafer 100 is removed. In this embodiment, the bonding adhesive 400 may be removed along with particles or etching by-products adhering to the surface of the bonding adhesive 400 by a wet cleaning process, thereby ensuring cleanness of the front sides of the dies 100c.

With continued reference to FIGS. 8 and 9, in this embodiment, after the bonding adhesive 400 is removed, the first insulating bonding layer 122 in the first hybrid bonding structure 120 may be preferably activated with plasma to enhance the bonding strength of the first insulating bonding layer 122. In alternative embodiments, as shown in FIG. 2b, the second insulating bonding layer 222 in the second hybrid bonding structure 220 may be activated with plasma to enhance the bonding strength of the second insulating bonding layer 222. Alternatively, both the first insulating bonding layer 122 in the first hybrid bonding structure 120 and the second insulating bonding layer 222 in the second hybrid bonding structure 220 may be activated with plasma.

Figure 10:
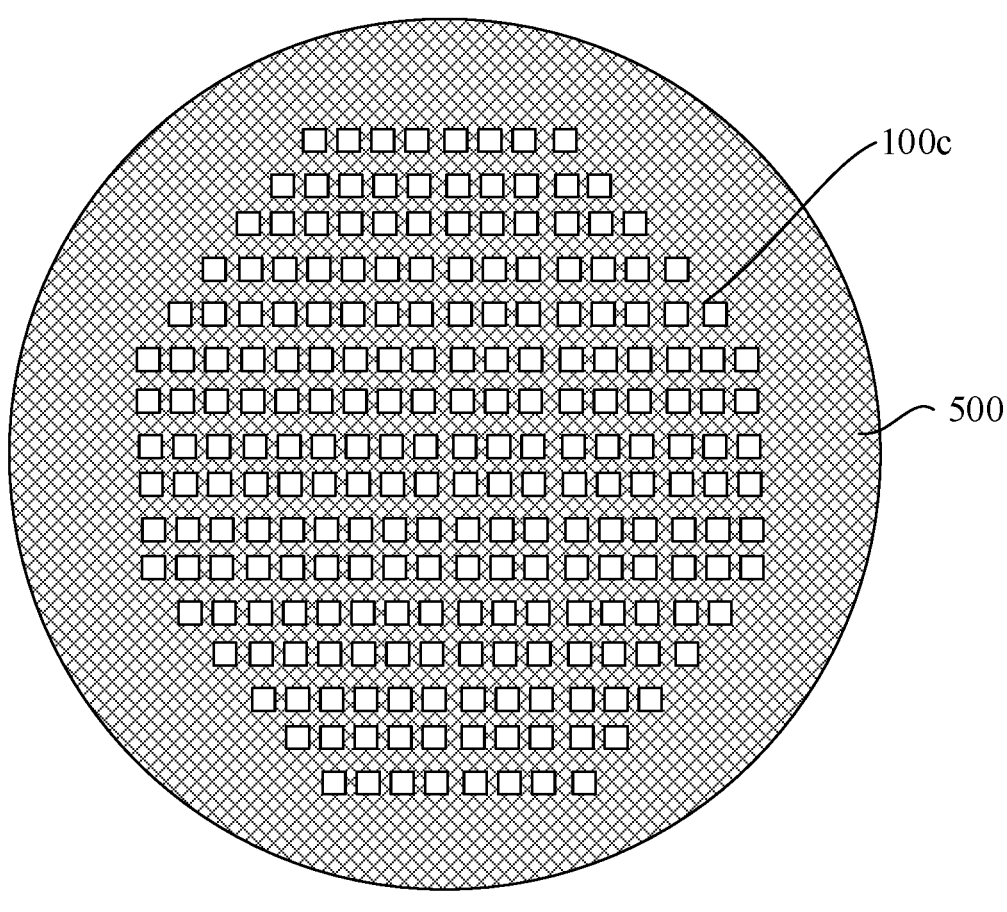

Referring to FIG. 10, the adhesive film 500 may be stretched to widen the gaps between adjacent dies 100c. This can facilitate removal of the good dies from the adhesive film 500.

Figure 11:
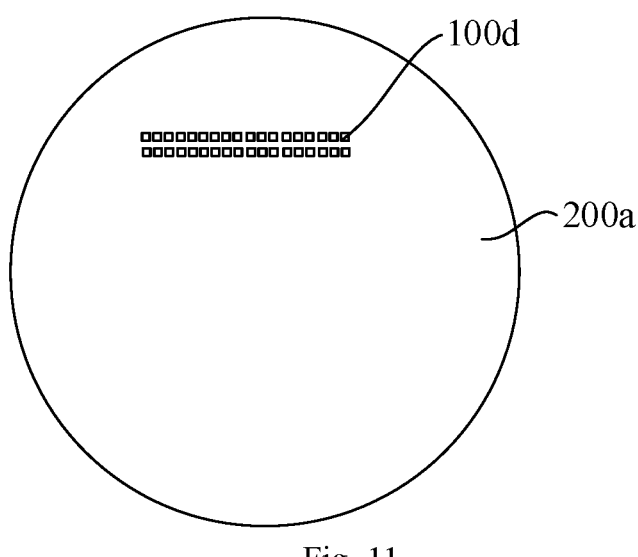

Referring to FIGS. 10 to 11, in conjunction with FIGS. 2b and 9, the good dies 100d are picked up from the adhesive film 500 by a die transfer device, such as a die transfer device equipped with a suction cup. The front sides of the good dies 100d are aligned with and bonded at to target regions of the front side 200a of the target wafer 200. Preferably, the target wafer 200 may also have been tested, and good dies thereon have been identified and marked. The good dies 100d may be aligned with and bonded to only good dies on the target wafer 200. The front side of each good die on the target wafer 200 has part of the second hybrid bonding structure 220. Each good die 100d from the device wafer 100 is aligned with a respective good die on the target wafer 200, and the two are then bonded together by means of bonds formed between the first hybrid bonding structure 120 of the good die 100d from the device wafer 100 and the second hybrid bonding structure 220 of the good die on the target wafer 200. In this way, it is ensured that each pair of bonded die is good, resulting in an increased yield of device fabricated from such pairs, avoiding wasting of dies and reducing rework.

Optionally, bonding the front sides of the good dies 100d from the device wafer 100 to the front sides of the good dies on the target wafer 200 may include the steps as follows.

At first, the good dies 100d on the device wafer 100 may be picked up from the adhesive film 500, and the locations of the good dies on the target wafer 200 may be determined. For ease of description, the good dies 100d from the device wafer 100 are referred to hereinafter as first dies, and the good dies on the target wafer 200 are referred to as second dies. Next, the first conductive bonding pads 121 in the first hybrid bonding structure 120 on the back sides of the first dies may be aligned with the second conductive bonding pads 221 in the second hybrid bonding structure 220 on the front side of the second dies, and the first insulating bonding layer 122 in the first hybrid bonding structure 120 on the back sides of the first dies with the second insulating bonding layer 222 in the second hybrid bonding structure 220 on the front side of the second dies, followed by performing a hybrid bonding process.

In the hybrid bonding process, since the first insulating bonding layer 122 and/or the second insulating bonding layer 222 have been activated with plasma, the good dies may be pre-bonded to the target wafer 200 simply by van der Waals forces at room temperature and atmospheric pressure. This reduces requirements on the bonding process and broadens the process window. After all the good dies have been pre-bonded to the target wafer 200, an annealing process can be performed to permanently bond the good dies to the target wafer 200 in one pass.

In addition, the time interval from the formation of the first hybrid bonding structure 120 on the front side 100a of the device wafer 100 and the front side 200a of the target wafer 200 to the coating of the bonding adhesive 400 on the front side 100a of the device wafer 100 is defined as a first waiting time, and the time interval from the removal of the bonding adhesive 400 to the bonding of the good dies 100d from the device wafer 100 at their front sides to the target wafer 200 with the aid of the first hybrid bonding structure 120 and the second hybrid bonding structure 220 as a second waiting time. Since the first hybrid bonding structure 120 is exposed during the first and second waiting times, the sum of the first and second waiting times is controlled within 24 hours or shorter, in order to additionally prevent the first conductive bonding pads 121 from being oxidized. In this embodiment, as the bonding adhesive 400 is coated on the front side 100*a* of the device wafer 100 as soon as the first hybrid bonding structure 120 is formed, the first waiting time can be effectively shortened, enabling effective control of the sum of the first and second waiting times. In this way, oxidation of the bonding structure can be prevented, resulting in improved bonding quality.

Additionally, in this embodiment, the first hybrid bonding structure 120 and the second hybrid bonding structure 220 are formed simultaneously, and after the second hybrid bonding structure 220 is formed, a special protective layer may be coated on the second hybrid bonding structure 220 to isolate it from air. However, it would be appreciated that the second hybrid bonding structure 220 may be formed at any desired time before the final bonding process, more preferably at a time closer to the final bonding process. This can shorten the time in which the second hybrid bonding structure 220 is exposed in air and thus prevent the second hybrid bonding structure 220 from being oxidized.

It would be appreciated that although the good dies have been described in the above embodiments as being bonded to the front side of the target wafer as an example, in practical applications with the target wafer consisting of two or more wafers bonded together, the good dies may be alternatively bonded to a back side of the target wafer. However, a detailed description in this regard is omitted for brevity.

In summary, in the die bonding method provided in embodiments of the present invention, through coating the bonding adhesive on the front side of the device wafer and bonding the carrier wafer thereto, the back-side connection structure can be formed on the back side of the device wafer to lead out the interconnect structure in the device wafer to the back side of the device wafer and the dies can be bonded at their front sides to the target wafer. Moreover, after the device wafer is debonded from the carrier wafer, the bonding adhesive is retained on the front side of the device wafer in order to provide protection to the front side of the device wafer during the subsequent dicing of the device wafer, and to avoid particles or etching by-products produced during the dicing process from adhering to the front side of the device wafer. Such etching by-products are subsequently removed along with the bonding adhesive, ensuring cleanness of the front sides of the individual dies resulting from the dicing process and improved quality of bonding of the dies at their front sides thereof to the target wafer.

Additionally, during the dicing of the device wafer, the bonding adhesive remaining on the front side of the device wafer can function in the same way as photoresist. As the etchant used in the etching of the substrate generally shows a high selectivity to the adhesive, the adhesive can protect the front side of the device wafer against possible damage that may be caused by the etching process, thus dispensing with the need for additional photoresist coating and exposure. This results in increases in process simplicity and production efficiency.

Further, the back-side connection structure is formed after the bonding adhesive is coated and the carrier wafer is bonded to provide support. With the front side of the device wafer being protected by the bonding adhesive, no process step or process complexity will be added.

Further, the conductive bonding pads in the first hybrid bonding structure are often made of copper, which is susceptible to oxidation that may lead to degraded bonding quality. The bonding adhesive retained on the front side of the device wafer after the device wafer is debonded from the carrier wafer can prevent to some extent the conductive bonding pads from being oxidized, resulting in improved bonding quality.

Further, the time interval from the formation of the matching hybrid bonding structures respectively on the front side of the device wafer and the front side of the target wafer to the coating of the bonding adhesive on the front side of the device wafer is defined as a first waiting time, and the time interval from the removal of the bonding adhesive to the bonding of the good dies from the device wafer at their front sides to the target wafer with the aid of the hybrid bonding structures as a second waiting time. Since the conductive bonding pads in the device wafer is exposed in air during the first and second waiting times, the sum of the first and second waiting times is controlled within 24 hours or shorter, thereby additionally preventing the conductive bonding pads from being oxidized.

Further, compared with testing the device wafer and marking good dies thereon after the completion of fabrication thereof, testing the device wafer and marking good dies thereon after the back-side connection structure is formed on the back side of the device wafer enables screening out of any die that becomes defective during the bonding of the carrier wafer or during the formation of the back-side connection structure, resulting in an increased yield of the resultant bonded dies.

Further, after the bonding adhesive is removed and before the good dies are bonded at their front sides to the target wafer, the insulating bonding layer(s) in the first hybrid bonding structure and/or the second hybrid bonding structure may be activated with plasma to have enhanced bonding strength. As a result, the good dies can be pre-bonded to the target wafer at room temperature and atmospheric pressure, reducing the requirements on the bonding process and broadening the process window.

It is to be noted that the embodiments disclosed herein are described in a progressive manner with the description of each embodiment focusing on its differences from others, and reference can be made between the embodiments for their identical or similar parts. Since the system embodiments correspond to the method embodiments, they are described relatively briefly, and reference can be made to the method embodiments for details of the system embodiments.

It is also to be noted that while the present invention has been described with reference to several preferred embodiments, the forgoing embodiments are not intended to limit the invention. In light of the teachings hereinabove, any person familiar with the art may make various possible variations and changes to the disclosed embodiments or modify them into equivalent alternatives, without departing from the scope thereof. Accordingly, any and all such simple variations, equivalent alternatives and modifications made to the foregoing embodiments without departing from the scope of the invention are intended to fall within the scope thereof.

It is to be noted that, as used herein, the terms "first", "second" and the like are only meant to distinguish various components, elements, steps, etc. From each other rather than necessarily indicate logical or sequential orderings thereof, unless otherwise indicated or specified.

Further, it is also to be recognized that the terminology used herein is for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and sub-means. All conjunctions used are to be understood in the most inclusive sense possible. Thus, the term "or" should be understood as having the definition of a logical "or" rather than that of a logical "exclusive or" unless the context clearly necessitates otherwise. Further, implementation of the method and/or device according to the embodiments of the present invention may involve performing selected tasks manually, automatically, or a combination thereof.

Presented above are merely a few preferred embodiments of the present invention, which do not limit the invention in any way. Changes in any forms made to the principles and teachings disclosed herein, including equivalents and modifications, by any person of ordinary skill in the art without departing from the scope of the invention are intended to fall within the scope of the invention.

What is claimed is:

1. A die bonding method, comprising:
providing a device wafer, a front side of the device wafer having a first hybrid bonding structure formed thereon, the first hybrid bonding structure comprises conductive bonding pads, a material of the conductive bonding pads in the first hybrid bonding structure comprises copper;
coating a bonding adhesive on the front side of the device wafer and temporarily bonding a carrier wafer to the front side of the device wafer;
forming a back-side connection structure on a back side of the device wafer, the back-side connection structure electrically connected to a first interconnect structure in the device wafer;
debonding the device wafer from the carrier wafer, with the bonding adhesive being retained;
dicing the device wafer from the front side of the device wafer, thereby separating the device wafer into a plurality of individual dies, the bonding adhesive covers the first interconnect structure, configured to isolate the conductive bonding pads from external environment during the dicing process; and
removing the bonding adhesive and providing a target wafer, a surface of the target wafer having a second hybrid bonding structure formed thereon, and bonding front sides of good dies to the target wafer with the aid of the first hybrid bonding structure and the second hybrid bonding structure.

2. The die bonding method of claim 1, further comprising, attaching an adhesive film to the back side of the device wafer, before the device wafer is debonded from the carrier wafer.

3. The die bonding method of claim 2, further comprising, after the back-side connection structure is formed on the back side of the device wafer and before the adhesive film is attached to the back side of the device wafer, testing all the dies of the device wafer to mark the good dies.

4. The die bonding method of claim 1, wherein the back-side connection structure comprises through-silicon vias and pads.

5. The die bonding method of claim 1, wherein the device wafer comprises a substrate and a dielectric layer on the substrate, wherein the first interconnect structure of the device wafer is formed in the dielectric layer, and wherein the step of dicing the device wafer from the front side of the device wafer into the individual dies comprises:
cutting at least the bonding adhesive, the first hybrid bonding structure and the dielectric layer from the front side of the device wafer with a grind wheel to form horizontal and vertical dicing lanes, the dicing lanes expose a surface of the substrate or extend into the substrate; and
performing an etching process along the dicing lanes, which proceeds downward through the substrate, thereby completely separating adjacent dies.

6. The die bonding method of claim 2, wherein after the bonding adhesive is removed, the adhesive film is stretched to widen gaps between adjacent dies.

7. The die bonding method of claim 1, wherein each of the first and second hybrid bonding structures comprises an insulating bonding layer and conductive bonding pads, the conductive bonding pads located within the insulating bonding layer, the conductive bonding pads in the first hybrid bonding structure electrically connected to the first interconnect structure in the device wafer, the conductive bonding pads in the second hybrid bonding structure electrically connected to a second interconnect structure in the target wafer.

8. The die bonding method of claim 7, wherein during the front sides of the good dies are boned to the target wafer with the aid of the first hybrid bonding structure and the second hybrid bonding structure, the insulating bonding layers in the first and second hybrid bonding structures are aligned with each other, with top surfaces of the insulating bonding layers adhering to each other, and the conductive bonding pads in the first and second hybrid bonding structures are aligned with each other, with gaps being left between the top surfaces.

9. The die bonding method of claim 7, further comprising, after the bonding adhesive is removed and before the front sides of the good dies are boned to the target wafer with the aid of the first and second hybrid bonding structures, activating the insulating bonding layers of the first hybrid bonding structure and/or the second hybrid bonding structure with plasma.

10. The die bonding method of claim 7, wherein wherein an time interval from the formation of the first hybrid bonding structure on the front side of the device wafer to the coating of the bonding adhesive on the front side of the device wafer is defined as a first waiting time and a time interval from the removal of the bonding adhesive to the bonding of the front sides of the good dies to the target wafer with the aid of the first and second hybrid bonding structures as a second waiting time, and the sum of the first and second waiting time is shorter than or equal to 24 hours.

11. The die bonding method of claim 1, wherein the device wafer has undergone a redistribution layer forming process but not an aluminum pad forming process, the target wafer has undergone a redistribution layer forming process and/or an aluminum pad forming process.

12. The die bonding method of claim 1, wherein the bonding adhesive is removed using a wet cleaning process.

* * * * *